United States Patent
El Rai et al.

(10) Patent No.: US 7,633,359 B2
(45) Date of Patent: Dec. 15, 2009

(54) MONOLITHICALLY INTEGRATABLE LC CIRCUIT ARRANGEMENT

(75) Inventors: Samir El Rai, Duisburg (DE); Ralf Tempel, Duisburg (DE)

(73) Assignee: Atmel Duisburg GmbH, Duisburg (DE)

( * ) Notice: Subject to any disclaimer, the term of this patent is extended or adjusted under 35 U.S.C. 154(b) by 52 days.

(21) Appl. No.: 11/882,113

(22) Filed: Jul. 30, 2007

(65) Prior Publication Data
US 2008/0048760 A1    Feb. 28, 2008

Related U.S. Application Data

(60) Provisional application No. 60/834,171, filed on Jul. 31, 2006.

(30) Foreign Application Priority Data
Jul. 29, 2006    (DE) ............... 10 2006 035 204

(51) Int. Cl.
  *H03H 7/00* (2006.01)
  *H03H 7/01* (2006.01)
(52) U.S. Cl. ................... 333/175; 333/185
(58) Field of Classification Search .......... 333/175, 333/185
  See application file for complete search history.

(56) References Cited

U.S. PATENT DOCUMENTS

| | | | |
|---|---|---|---|
| 5,483,207 A |   | 1/1996 | Gabara |
| 5,492,856 A | * | 2/1996 | Ikeda et al. ............ 438/381 |
| 5,602,517 A | * | 2/1997 | Kaneko et al. ......... 333/185 |
| 6,060,759 A |   | 5/2000 | Dhong et al. |
| 6,438,000 B1 | * | 8/2002 | Okamoto et al. ....... 363/40 |
| 6,469,596 B2 | * | 10/2002 | Hull et al. ............ 333/185 |
| 6,476,689 B1 | * | 11/2002 | Uchida et al. .......... 333/177 |
| 6,476,690 B1 | * | 11/2002 | Nakata et al. .......... 333/185 |
| 6,590,473 B1 |   | 7/2003 | Seo et al. |
| 6,599,855 B2 | * | 7/2003 | Naito ................. 501/139 |
| 7,002,434 B2 | * | 2/2006 | Lin et al. ............. 333/167 |
| 7,064,411 B2 | * | 6/2006 | Hashizume et al. ..... 257/531 |
| 7,268,645 B2 | * | 9/2007 | Meltzer et al. ........ 333/175 |
| 7,365,627 B2 | * | 4/2008 | Yen et al. ............ 336/200 |

(Continued)

FOREIGN PATENT DOCUMENTS

WO    WO2005/034239 A2    4/2005

*Primary Examiner*—Benny Lee
*Assistant Examiner*—Kimberly E Glenn
(74) *Attorney, Agent, or Firm*—Muncy, Geissler, Olds & Lowe, PLLC

(57) ABSTRACT

A monolithically integratable circuit arrangement is provided, which has at least one inductor, formed as a conductor loop, and at least one capacitor, connected to the conductor loop. According to the invention, the circuit arrangement comprises (a) at least one first conductor loop placed in at least one first metallization level and having a first DC terminal for applying a first DC potential, (b) at least one second conductor loop placed in at least one second metallization level and having a second DC terminal for applying a second DC potential, (c) at least one metal-isolator-metal capacitor with a capacitor plate, which is placed in a third metallization level between the first and second metallization level, and (d) at least one metallic connecting means placed between the capacitor plate and the first conductor loop, said means which connects the capacitor plate in an electrically conducting manner to the first conductor loop. The invention relates furthermore to an integrated circuit having a circuit arrangement of this type.

20 Claims, 3 Drawing Sheets

U.S. PATENT DOCUMENTS

| | | | |
|---|---|---|---|
| 7,429,899 B2 * | 9/2008 | Gabara | 331/117 R |
| 2003/0063427 A1 | 4/2003 | Kunihiro | |
| 2005/0184357 A1 | 8/2005 | Chiba | |
| 2006/0033602 A1 | 2/2006 | Mattsson | |
| 2007/0176727 A1 * | 8/2007 | Chen et al. | 336/232 |

* cited by examiner

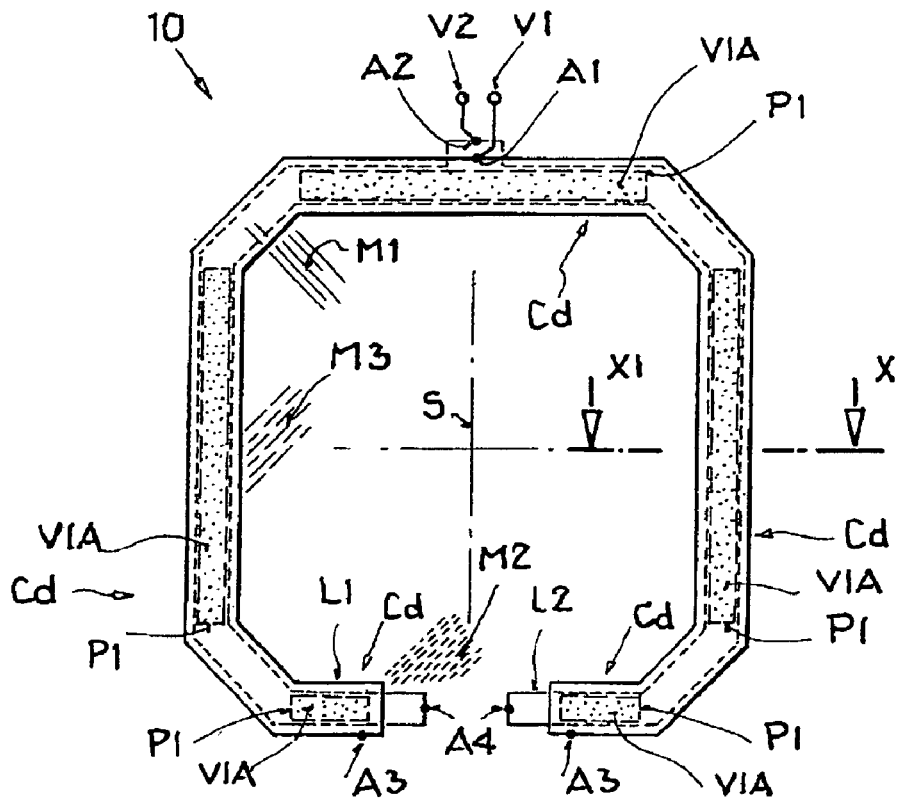
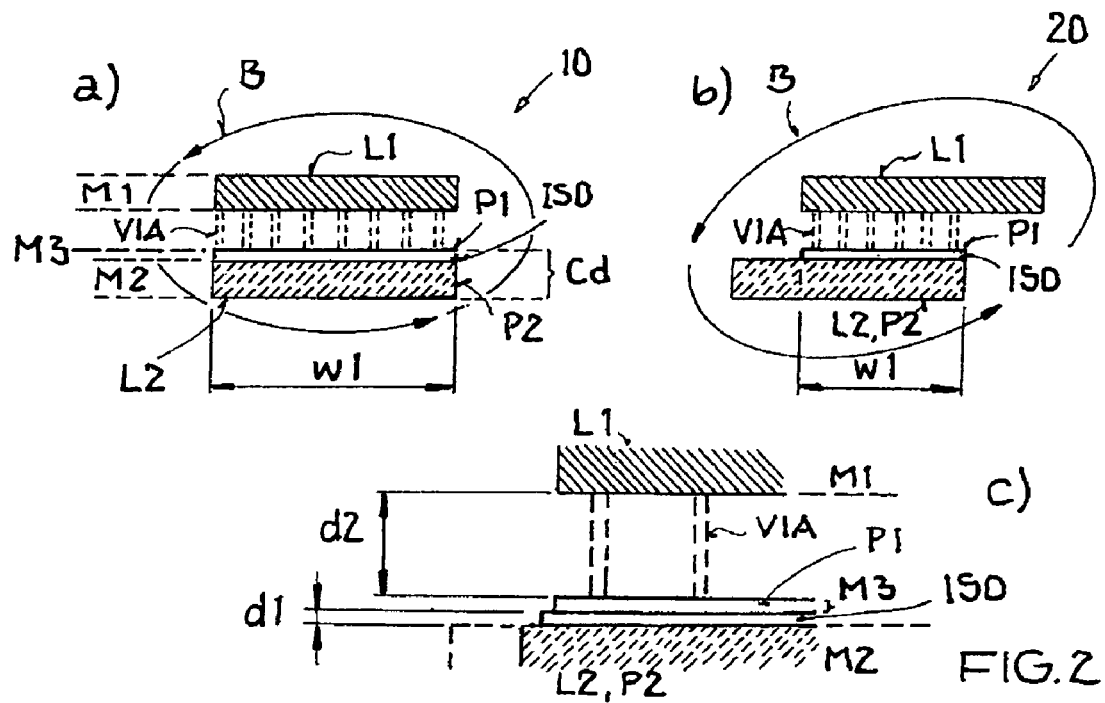

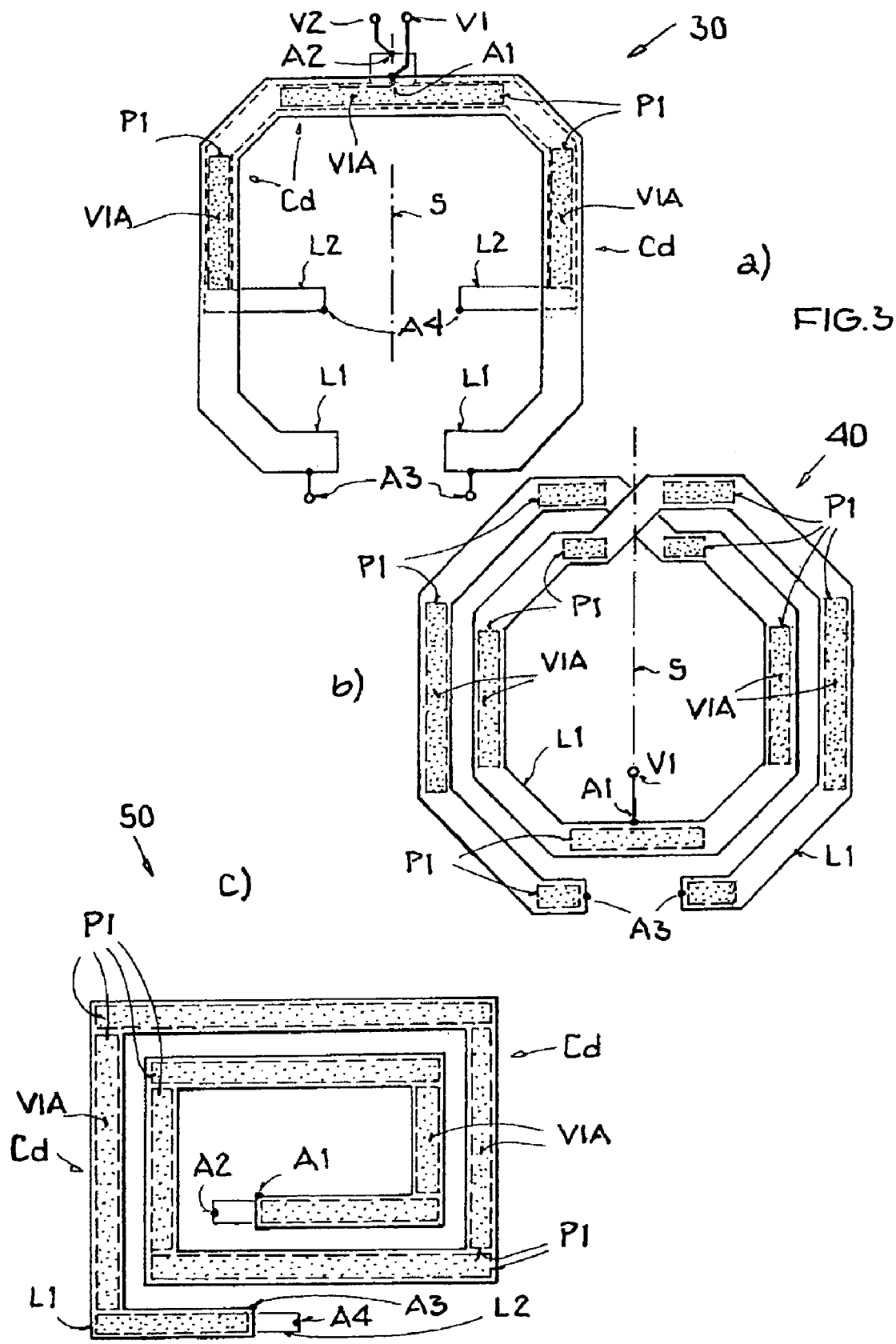

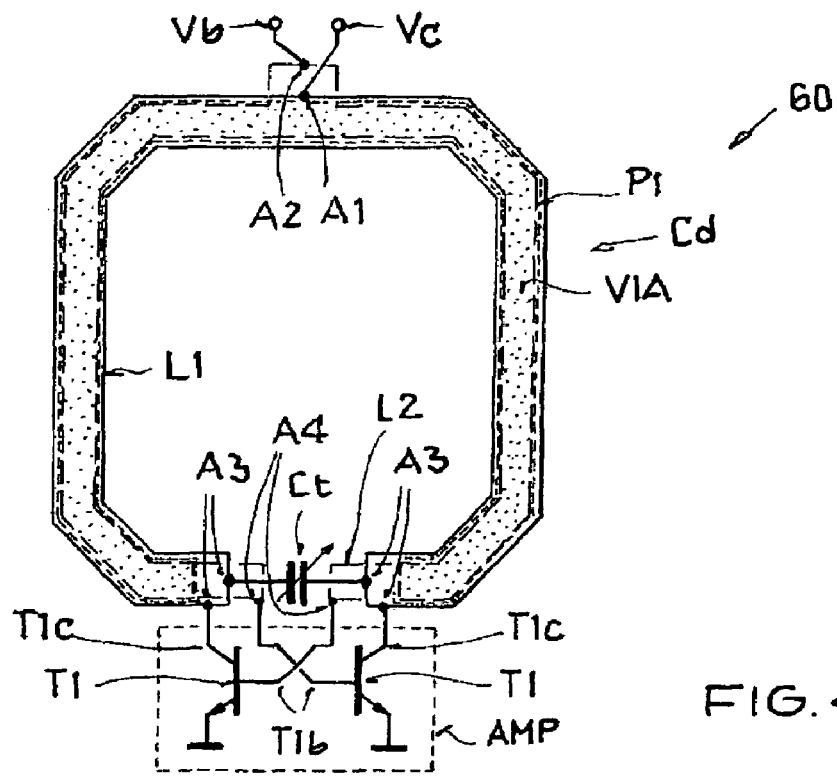
FIG. 4
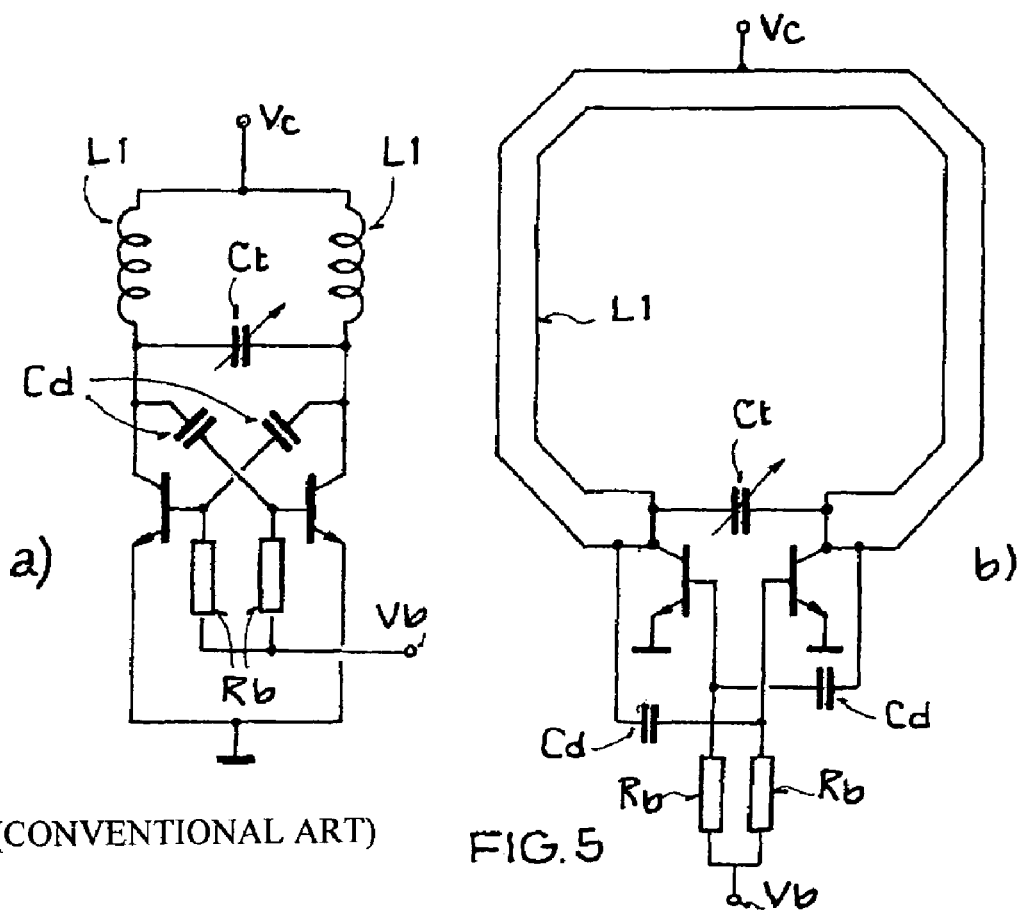
a) (CONVENTIONAL ART)
b) FIG. 5

MONOLITHICALLY INTEGRATABLE LC CIRCUIT ARRANGEMENT

This nonprovisional application claims priority to German Patent Application No. DE 10 2006 035 204, which was filed in Germany on Jul. 29, 2006, and to U.S. Provisional Application No. 60/834,171, which was filed on Jul. 31, 2006, and which are both herein incorporated by reference.

BACKGROUND OF THE INVENTION

1. Field of the Invention

The present invention relates to a monolithically integratable circuit arrangement having at least one inductor, formed as a conductor loop, and at least one capacitor, connected to the conductor loop, and relates to an integrated circuit with a circuit arrangement of this type.

2. Description of the Background Art

Circuit arrangements of this type are used particularly for the processing of high-frequency electromagnetic signals, for example, in the gigahertz range, e.g., in oscillators, mixers, amplifiers, filters, and matching circuits for transmitting/receiving devices of communication systems.

FIG. 5 shows by way of example a circuit diagram of a voltage-controlled oscillator (VCO) with a known circuit arrangement of this type. The differentially realized VCO has a tank circuit with an inductor formed as conductor loop L1 and a tunable capacitor Ct, as well as an amplifier circuit for maintaining (undamping) the oscillation. The amplifier circuit made as an emitter circuit is connected, both on the input side and on the output side, to the conductor loop which to clarify the size relationships is not shown symbolically in FIG. 5b but in the form of its layout. The collector terminals of the transistors of the amplifier circuit are supplied with the necessary DC potential (bias) Vc via a DC terminal in the middle of the conductor loop, whereas the DC potential Vb is supplied to the base terminals via (bias) resistors Rb. Capacitors Cd are provided to block off DC compensating currents.

The inductor ("coil") is therefore used simultaneously in the high-frequency range (as part of the tank circuit) and utilized as the DC feed. As a coupling element, it is connected between the inputs and outputs of the amplifier transistors, so that blocking capacitors Cd are necessary because of its DC conductivity.

It is a disadvantage here that the arrangement of the elements in the area of both ends of the conductor loop is problematic. The capacitive elements Ct, Cd require a relatively large (chip) area, so that long supply lines are needed in part, which causes an increase in parasitic effects, or else the surface area of the capacitive elements must be limited, which has a disadvantageous effect on the efficiency of the VCO circuit (limited frequency tunability, rather high phase noise, etc.).

Another disadvantage is that even minor differences in the resistance values of the two bias resistors Rb, e.g., due to technology or process variations, lead to different potentials at the bases of the transistors and thereby to different collector currents. This has the result of an asymmetric operation (offset), which disadvantageously results in increased noise and a lower output power.

It is disadvantageous in addition that the blocking capacitors Cd narrow the usable frequency tuning range and as a result of parasitic capacitors worsen the entire electrical behavior of the circuit.

SUMMARY OF THE INVENTION

It is therefore an object of the present invention to provide a circuit arrangement, which is simple and cost-effective to implement, has a reduced space requirement, enables symmetric operation, and can be used flexibly in oscillators, mixers, amplifiers, filters, matching circuits, etc., without detrimentally affecting their efficiency.

The monolithically integratable circuit arrangement of the invention comprises (a) at least one first conductor loop placed in at least one first metallization level M1 and having a first DC terminal for applying a first DC potential, (b) at least one second conductor loop placed in at least one second metallization level M2 and having a second DC terminal for applying a second DC potential, (c) at least one metal-isolator-metal capacitor with a capacitor plate, which is placed in a third metallization level M3 between the first and second metallization level M1 or M2, and (d) at least one metallic connecting means placed between the capacitor plate and the first conductor loop, said means which connects the capacitor plate in an electrically conducting manner to the first conductor loop.

The integrated circuit of the invention has a circuit arrangement of this type.

An aspect of the invention is to place at least one second conductor loop in at least one second metallization level M2 and at least one capacitor plate in a third metallization level M3, which lies between the levels M1 and M2, in order to integrate at least one MIM capacitor. In this way, a three-dimensional element, which is simple to implement, advantageously has a reduced space requirement and enables a more flexible and place-saving arrangement of other elements in the area of the conductor loop ends.

Furthermore, the integration of the MIM capacitor/s enables the feeding of a second, different DC potential at a second DC terminal of the second conductor loop, so that active elements, such as, e.g., transistors of corresponding circuits (oscillators, filters, mixers, amplifiers, matching circuits, etc.), can be supplied separately with different DC potentials. Bias resistors are not necessary for this, which enables symmetric operation without offset and leads to a lower noise level.

Because of the greater line cross section, the ohmic resistance of the circuit arrangement declines in addition, so that the properties of the inductor ("coil") improve. Magnetic losses are largely avoided by the metallic connecting means ("via") between the capacitor plate and the first conductor loop.

In addition, with the aforementioned blocking capacitors, their parasitic capacitances are eliminated, so that, e.g., the usable frequency tuning area of a VCO is not limited and deterioration of electrical circuit properties does not occur.

In an embodiment of the circuit arrangement, the second conductor loop forms another capacitor plate of the MIM capacitor. In this way, the circuit arrangement is especially simple to implement.

In another embodiment, the capacitor plate can be placed between a section of the first conductor loop and a neighboring section of the second conductor loop. Because the capacitor plate is placed between two sections of the conductor loops, which in the plan view lie one on top of another or at least overlap in part, the metallic connecting means can be formed advantageously as simple plated through-holes, which are arranged perpendicular to the metallization levels.

In another embodiment, the MIM capacitor can have an insulator layer whose thickness is substantially smaller than its width, which corresponds substantially to the trace width or else the width of the overlap area of the traces. Preferably, the width of the insulator layer is at least a hundred times the thickness of the insulator layer. By this means, the interior space of the MIM capacitor and thereby the interior space between the two conductor loops are virtually free of magnetic field lines, so that magnetic losses are very greatly reduced.

In another embodiment, the metallic connecting means can be formed as a plated through-hole ("via"), which is preferably arranged perpendicular to one of the metallization levels. This type of circuit arrangement is especially simple to implement.

The first and/or second DC terminals can be placed in a symmetry plane positioned perpendicular on a metallization level. In this way, a best possible symmetry is advantageously assured in differential circuit arrangements.

In yet another embodiment, the first conductor loop can have at least one first AC terminal for applying or tapping off a first high-frequency signal and/or the second conductor loop has at least one second AC terminal for applying or tapping off a second high-frequency signal. In this way, the circuit arrangement can advantageously process high-frequency signals such as, e.g., input and output signals from amplifiers.

The first and/or the second AC terminals can be placed mirror-symmetrically relative to a symmetry plane positioned perpendicular on one of the metallization levels. In this way, a best possible symmetry is advantageously assured in differential circuit arrangements.

In an embodiment, the first and the second conductor loops are placed overlapping at least in one section. In this way, at a specified tracer width, the capacitive coupling of both conductor loops can be advantageously set.

In an embodiment, the first and second conductor loops are formed congruent at least in one subsection. At a specified trace width this makes possible a maximization of the capacitive coupling and a simple and area-saving implementation.

The first and second conductor loops can be formed congruent with the exception of areas around their terminals. As a result, magnetic losses are especially greatly reduced.

In another embodiment, the circuit arrangement comprises at least one third conductor loop placed in at least one fourth metallization level and having a third DC terminal for applying a third DC potential, at least one second metal-isolator-metal capacitor with a second capacitor plate, which is placed in a fifth metallization level between the fourth and first metallization levels or between the fourth and second metallization levels, and at least one second metallic connecting means placed between the second capacitor plate and a neighboring conductor loop, said means which connects the capacitor plate in an electrically conducting manner to the neighboring conductor loop. For example, amplifiers can be supplied advantageously with three different DC potentials in this way.

An amplifier unit is provided with a first and a second terminal, whereby the first terminal is connected to the first conductor loop and the second terminal to the second conductor loop, and the first terminal can be supplied with the first DC potential via the first DC terminal and the first conductor loop and the second terminal with the second DC potential via the second DC terminal and the second conductor loop. An oscillator, amplifier, filter, etc., implemented with a circuit arrangement of this type is supplied advantageously with different DC potentials without bias resistors via separate DC paths, utilizes only a small chip area, and has a high efficiency.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a first exemplary embodiment of a circuit arrangement of the invention (plan view);

FIG. 2 is cross sections of circuit arrangements of the invention according to an embodiment of the present invention;

FIG. 3 illustrates additional exemplary embodiments of a circuit arrangement of the invention (plan view);

FIG. 4 is another exemplary embodiment of a circuit arrangement of the invention for a voltage-controlled oscillator (plan view); and FIG. 5 is a voltage-controlled oscillator according to the state of the art.

DETAILED DESCRIPTION

In the figures, the same and functionally identical elements and signals, if not specified otherwise, are provided with the same reference characters.

FIG. 1 shows a layout of a first exemplary embodiment of a circuit arrangement of the invention in a plan view.

The monolithically integrated circuit arrangement 10 has a conductor loop L1 placed in a first (upper) metallization level M1 and a conductor loop L2 placed in a second (lower) metallization level M2. Conductor loop L1 is equipped with a DC terminal A1 to apply a first DC potential V1 and with an AC terminal A3 to apply or tap off a first high-frequency signal, whereas conductor loop L2 has a DC terminal A2 to apply a second DC potential V2 and an AC terminal A4 to apply or tap off a second high-frequency signal.

Furthermore, a plurality of integrated metal-isolator-metal (MIM) capacitors Cd is provided with one each of a first (upper) capacitor plate P1 depicted as a rectangle, which are placed in a third (middle) metallization level M3 between levels M1 and M2 (and between neighboring sections of the two conductor loops L1, L2). The section, lying in each case below plate P1, of lower conductor loop L2 forms second (lower) capacitor plate P2 of the particular MIM capacitor Cd. Overall, in this exemplary embodiment for circuit arrangement 10, three parallel and spaced metallization levels M1, M2, and M3 are provided, whose distances and layer thicknesses will be described in greater detail below with reference to FIG. 2.

Between levels M1 and M3, metallic connectors VIA, shown as dots, are placed in the areas of the MIM capacitors Cd between upper conductor loop L1 and upper capacitor plate P1. The connectors connect the respectively upper capacitor plate P1 in an electrically conducting manner with the particular overlying section of upper conductor loop L1 and are preferably formed as plated through-holes (via).

Preferably, both conductor loops L1, L2, viewed from above, are made substantially congruent, as is evident in FIG. 1. Deviations from congruency can be advantageous particularly in areas of terminals A1-A4, e.g., to simplify the placement of other elements. Upper conductor loop L1 is shown in FIG. 1 with a slightly increased tracer width in comparison with lower conductor loop L2 only to simplify the drawing. Preferably, the conductor loops have a matching width.

In another embodiment, the conductor loops when viewed from above are substantially congruent only in one or more subareas or subsections and/or they overlap over their entire length or else in one or more subareas/subsections. Exemplary embodiments of this type are described hereafter with reference to FIGS. 2 and 3.

The circuit arrangement of the invention is preferably realized differentially, because advantageous properties result in many application cases (reduced phase noise, improved suppression of undesirable harmonics, etc.). As shown in FIG. 1, here conductor loops L1, L2, the MIM capacitors Cd, the connecting means VIA, and the differential AC terminals A3, A4 are designed mirror-symmetric relative to the symmetry plane S positioned perpendicular on a metallization level M1-M3. The DC terminals A1, A2 are located here in the middle area of their respective conductor loop, i.e., in an area that has the same distance along the conductor loop from its ends, and are preferably placed in the symmetry plane S, whereas the differential AC terminals A3, A4 are placed in the area of the ends of their respective conductor loop.

In another embodiment, the circuit arrangement of the invention is made non-differential ("single-ended"). In this case, the DC terminals are placed each at an end of the respective conductor loop and the non-differential AC terminals at the respective other end of the conductor loop.

In other embodiments, conductor loop L1 and/or conductor loop L2 has (have) other (differential or single-ended) AC terminals A3 or A4 for applying or tapping off other high-frequency signals.

According to FIG. 1, both conductor loops L1, L2 each have substantially one turn, which is made piecewise straight or polygonal. In another embodiment, the conductor loops or their turns assume a substantially round, oval, rectangular, square, etc., form.

In other exemplary embodiments, a plurality of conductor loops L1 and/or a plurality of conductor loops L2 are provided or conductor loops L1 and/or L2 each have more than one turn, which in turn are formed substantially piecewise straight, polygonal, round, oval, rectangular, square, etc. Each conductor loop L1, L2 is hereby placed in one or more metallization levels. Such exemplary embodiments are described hereafter with reference to FIG. 3.

Instead of five rectangular capacitor plates P1, in other embodiments MIM capacitors Cd or capacitor plates P1 can be selected in any number and in any shapes (in plan view). Preferably, the entire area, in which both conductor loops coincide or overlap in the plan view, is covered with one or more MIM capacitors, which taken as a whole optionally assume the shape of the covering or overlap area. In so far as the employed semiconductor technology makes it possible, only one MIM capacitor is provided whose plate P1 over the entire length follows the course of the covering or overlap area of the conductor loops and assumes its form. Alternatively, the plate can also follow this course in only one subsection. A plurality of MIM capacitors with piecewise straight, round, oval, rectangular, square, etc., shape can also be provided.

Finally, additional conductor loops can be placed in other metallization levels above level M1 and/or below level M2, which are connected via additional MIM capacitors and other metallic connecting means with the neighboring first or second conductor loop and each have one additional DC terminal, so that advantageously overall more than two DC potentials can be supplied to more than two DC terminals.

FIG. 2 shows cross sections of different exemplary embodiments of circuit arrangements of the invention.

Subfigure a) shows a cross section of circuit arrangement 10 according to FIG. 1 along line XI-XI. In particular, this subfigure shows conductor loops L1 and L2 placed in metallization levels M1 or M2 and upper capacitor plate P1 placed in metallization level M3 lying between M1 and M2. An insulator layer ISO is placed between upper capacitor plate P1 and lower capacitor plate P2 formed by conductor loop L2, so that a metal-isolator-metal (MIM) capacitor Cd results. Upper conductor loop L1 and upper capacitor plate P1 are connected in an electrically conducting manner via metallic connecting means VIA, which are preferably arranged perpendicular to metallization levels M1-M3 and therefore "stand" perpendicular on upper capacitor plate P1 and upper conductor loop L1. A layer, e.g., of silicon oxide is provided below level M2 and between M1 and M3.

As is evident from Subfigure a), the insulator layer ISO has a layer thickness d1 that is substantially smaller than its width w1, which in this exemplary embodiment coincides substantially with the width of the conductor loops.

Furthermore, it is evident from Subfigure a) that the insulator layer ISO has a layer thickness that is substantially thinner than that of conductor loops L1, L2 or metallizations M1, M2, and that is also substantially smaller than the distance between levels M1 and M3 or the length of the connecting means VIA.

Because of the aforementioned size relationship (d1<<w1) and the metallic connecting means VIA, which short-circuit capacitor plate P1 with conductor loop L1, the space between the two conductor loops is largely free of magnetic field lines, so that a magnetic induction field B encompassing both conductor loops results and both conductor loops therefore have a strong magnetic coupling. Magnetic losses due to a current displacement ("proximity effect") are largely avoided, whereas the electrical properties of the inductor improve due to conductor loop L2, because the parasitic (trace) resistance declines and thereby the ohmic losses are reduced.

The integration of MIM capacitors between the two conductor loops L1, L2 produces a three-dimensional element, which advantageously has a reduced space requirement and enables a more flexible and space-saving arrangement of other elements, e.g., at the ends of the conductor loops.

Furthermore, the integration of MIM capacitors enables a splitting into two separate DC paths with simultaneous maintenance of the same properties in the high frequency range. Thus, at DC terminals A1 and A2 (see FIG. 1) different DC potentials V1 or V2 can be applied advantageously, which are supplied separately via the two conductor loops L1 or L2 and the AC terminals A3 or A4 to the circuits corresponding to the active element(s) (transistors, etc.) (oscillators, amplifiers, filters, matching circuits, etc.). The AC terminals A3 and A4 are therefore separated DC-wise. In the high-frequency range, the AC terminals A3 and A4 are essentially short-circuited, so that the high-frequency signals applied at them are highly coupled AC-wise (ideally identically). The problematic supplying of DC potentials via semiconductor resistors (bias resistors, see FIG. 5) can therefore be advantageously eliminated, so that symmetric operation is made possible.

Subfigure b) shows a cross section of another exemplary embodiment. The two conductor loops L1, L2 of circuit arrangement 20 in the plan view (in FIG. 2b from top to bottom) are not designed as congruent but overlapping. Therefore, the conductor loops in the cross section of Subfigure b) are depicted not directly one over another but horizontally displaced. The MIM capacitor Cd and the connecting means VIA extend here over the overlapping area of the two conductor loops. The thickness d1 of the insulator layer ISO in this exemplary embodiment is also much smaller than its width w1, which in this case, however, essentially corresponds to the width of the overlapping area.

Subfigure c) shows an enlarged detail from Subfigures a) and b). The subsequently provided size relationships by way of example refer to an integrated circuit arrangement, realized by the applicant in a 0.35-μm BiCMOS technology, for a voltage-controlled oscillator of a "WiMax" transceiver according to IEEE 802.16 (worldwide interoperability for microwave access), which will be described in greater detail hereafter with reference to FIG. 4. Whereas the layer thicknesses of metallizations M1 and M2, but also the distance between levels M1 and M2, are in the range of about 600-1400 nm, typically around 1 μm, insulator layer ISO has a much smaller thickness d1 in the range of about 20-50 nm, typically around 40 nm. The metallization M3 has a thickness in the range of 35-200 nm, typically around 40 nm. Distance d2 between upper conductor loop L1 and capacitor plate P1 (or the length of the connecting means VIA), in this case, is therefore much greater than distance d1 between lower conductor loop L2 and capacitor plate P1 (or the thickness of the insulator layer).

The width w1 of the insulator layer ISO, which corresponds substantially to the width of the conductor loops (see FIG. 2a) or else to the width of the overlapping area of the conductor loops (see FIG. 2b), lies in a range of about 5-100 μm, typically around 30 μm, and is therefore greater by a multiple than the thickness d1 of insulator layer ISO. The width w1 of the insulator layer/the conductor loops/the overlapping area is preferably at least a hundred times the thickness d1 of the insulator layer ISO.

FIG. 3 shows, in each case in plan view, the layout of further exemplary embodiments of the circuit arrangement of the invention.

Circuit arrangement 30 shown in Subfigure a) has an upper conductor loop L1 and a lower conductor loop L2, which are congruent only in their upper half and neither congruent nor overlapping particularly in the area of their AC terminals A3, A4. Capacitor plates P1 and thereby MIM capacitors Cd are limited to the area in which they cover conductor loops L1, L2. This type of embodiment is particularly advantageous when signals with different amplitudes are desired at AC terminals A3 and A4, whereby in the case of FIG. 3a, AC terminal A4 is supplied with the signal of the lower amplitude. This is the case, e.g., in amplifiers that achieve optimal power amplification at certain different amplitudes at the input and output.

Circuit arrangement 40 shown in Subfigure b) has an upper conductor loop L1 with two turns, which are placed in a total of two metallization levels. Almost all sections of conductor loop L1 hereby lie in an upper metallization level M1a. Only a short section in the crossing area, in FIG. 3a from top left to bottom right, lies in a metallization level M1b below M1a and is connected at its ends by plated through-holes to L1 sections lying in level M1a. Conductor loop L1 has a DC terminal A1 for applying a DC potential V1 and an AC terminal A3 for applying or tapping off a first high-frequency signal and is formed mirror-symmetric to the symmetry plane S. Along conductor loop L1, DC terminal A1 is placed in the middle of the trace, whereas AC terminal A3 is placed at the ends of the trace and is made symmetric to plane S.

Preferably, the lower conductor loop L2, not shown in FIG. 3b, also has two turns, is placed in two metallization levels M2a, M2b, and is formed substantially congruent with upper conductor loop L1. Almost all sections of L2 hereby lie in a lower level M2b and only one section in the crossing area from bottom left to top right in a level M2a above level M2b.

Preferably, circuit arrangement 40 utilizes a total of only two metallization levels for the two conductor loops L1, 12, whereby, on the one hand, the aforementioned levels M1a and M2a and, on the other, levels M1b and M2b coincide. The upper metallization level M1a=M2a, with the exception of the crossing section from top left to bottom right, hereby has all sections of L1 and parallel to the L1 crossing section from top left to bottom right, the L2 crossing section from bottom left to top right, whereas the lower metallization level M1b=M2b with the exception of a crossing section from bottom left to top right contains all sections of L2 and parallel to the L2 crossing section from top left to bottom right the L1 crossing section from top left to bottom right. Upper capacitor plate P1 and the connecting means VIA in this exemplary embodiment are located in turn between the upper level M1a=M2a and the lower level M1b=M2b, but not in the crossing area.

In other exemplary embodiments, lower conductor loop L2 in a plan view is made overlapping with upper conductor loop L1 at least in one subsection. In addition, in other exemplary embodiments, more than two turns are provided per conductor loop.

Subfigure c) shows a non-differential ("single-ended") circuit arrangement 50 with a spiral-shaped upper conductor loop L1 with two turns, which are placed in a metallization level M1. Lower conductor loop L2 is placed in a metallization level M2 and is formed substantially congruent with L1. DC terminals A1, A2 are placed at the internal ends of conductor loops L1 or L2, whereas AC terminals A3, A4 are provided at the external ends. This type of circuit arrangement can be used advantageously for adjusting an amplifier with a capacitively acting input to a desired wave impedance value.

The circuit arrangement of the invention can be used advantageously in highly diverse applications in oscillators, mixers, amplifiers, filters, matching circuits, etc., as will be described hereafter with use of another exemplary embodiment.

FIG. 4 shows a circuit diagram of another exemplary embodiment of a circuit arrangement of the invention for a voltage-controlled oscillator (7 GHz) of a "WiMax" transceiver according to IEEE 802.16.

Circuit arrangement 60 has two conductor loops L1, L2, an amplifier unit AMP connected to both conductor loops, and a capacitive unit Ct connected to upper conductor loop L1.

Conductor loops L1, L2 are formed largely in agreement with the previously described first exemplary embodiment (see FIGS. 1, 2a, and 2c). Upper conductor loop L1 has a total of two (differential) AC terminals A3 for applying or tapping off a high-frequency signal in each case. Instead of several MIM capacitors (see FIG. 1), according to FIG. 4, only a single MIM capacitor Cd is provided whose capacitor plate P1 extends substantially over the entire extent of the conductor loops. Metallic connecting means VIA, which also extend over the entire extent of the conductor loops or the capacitor plate, are provided in turn for the conductive connection of conductor loop L1 with capacitor plate P1.

The amplifier unit AMP in this exemplary embodiment has two bipolar transistors T1 in an emitter circuit. Collector terminals T1c of transistor T1 are hereby connected via a first terminal (output) of the amplifier unit to an AC terminal A3 of upper conductor loop L1, whereas the base terminals T1b of transistors T1 are connected via a second terminal (input) of the amplifier unit to AC terminal A4 of lower conductor loop L2. The emitter terminals of the two transistors are at a reference potential, such as, e.g., ground.

The capacitive unit Ct is connected to another AC terminal A3 of upper conductor loop L1 and for setting the oscillation frequency, for example, in the range of about 6.5 GHz to about 7.5 GHz, has an adjustable capacitance value, which is set with the use of at least one control signal.

Capacitive unit Ct has, for example, a unit with a continuously variable capacitance value, such as, e.g., a varactor, capacitive, or MOS diode (metal oxide semiconductor), or an MEM varactor (microelectromechanical), and/or a unit with a stepwise variable capacitance value, which is made, e.g., as a switched MIM capacitor (metal-insulator-metal), switched polycap, or as a switched capacitor bank (capacitive digital-to-analog converter, CDAC). Preferably, capacitive unit Ct has a varactor diode and a switched capacitor bank (CDAC).

Because of the MIM capacitor Cd integrated between the conductor loops, conductor loops L1, L2 are decoupled DC-wise. The collector terminals T1c of transistors T1 are therefore supplied with a first DC potential (bias) Vc via a first DC path, which extends from DC terminal A1 via upper conductor loop L1 to first AC terminal A3, whereas base terminals T1b are supplied with a different second DC potential Vb via a second DC path, which extends from DC terminal A2 over lower conductor loop L2 to AC terminal A4. Semiconductor resistors (bias resistors) in the DC paths (see FIG. 5) are therefore advantageously eliminated, so that symmetric operation is enabled in a simple manner.

By integration of the MIM capacitors between the two conductor loops, furthermore, the otherwise necessary blocking capacitors are eliminated (see FIG. 5). As is evident from FIG. 4, in the area of the ends of the conductor loops, now only capacitive unit Ct and transistors T1 are to be placed and appropriately connected. For this reason, the lines to the terminal of units Ct and T1 are made shorter and/or the surface area of these units is increased, so that advantageously parasitic effects are reduced (and thereby the quality increases and the noise level declines) and/or the efficiency of the VCO is improved (broader frequency tuning range, lower phase noise, etc.). With the aforementioned blocking capacitors, their parasitic capacitances are eliminated in addition, so that the usable frequency tuning range is broadened and improvement of electrical circuit properties occurs.

In other exemplary embodiments, the bipolar transistors are connected in a collector or else base circuit or field-effect transistors (e.g., MOSFET) are used, which are connected to a source, drain, or gate circuit. Finally, the circuit arrangement can also be realized as non-differential.

Apart from oscillators, the circuit arrangement of the invention can also be used for realizing many other circuits. The circuit arrangement of the invention can be used advantageously whenever an inductor is used simultaneously in the high-frequency range and as a DC supply and in addition is connected as a coupling element between an input and an output of the same or different amplifier elements (transistors, etc.). Examples of such circuits are amplifiers, mixers, filters, matching circuits, etc.

The circuit arrangement of the invention is preferably a component of an integrated circuit (IC), which, e.g., is made as a monolithically integrated circuit using a standard technology, for example, a BiCMOS technology, as a hybrid circuit (thin- or thick-layer technology), or as a multilayer-ceramic circuit.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monolithically integratable LC circuit arrangement comprising:
   at least one first conductor loop provided in at least one first metallization level and having a first DC terminal for applying a first DC potential;
   at least one second conductor loop provided in at least one second metallization level and having a second DC terminal for applying a second DC potential;
   at least one metal-isolator-metal capacitor with a capacitor plate that is provided in a third metallization level between the first and second metallization level; and
   at least one metallic connector provided between the capacitor plate and the first conductor loop, the metallic connector connecting the capacitor plate in an electrically conductive manner to the first conductor loop, the second conductor loop being electrically insulated from the capacitor plate.

2. The circuit arrangement according to claim 1, wherein the metal the at least one metal-isolator-metal capacitor has another capacitor plate formed by the second conductor loop.

3. The circuit arrangement according to claim 1, wherein the capacitor plate is provided between a section of the first conductor loop and a neighboring section of the second conductor loop.

4. The circuit arrangement according to claim 1, wherein the at least one metal-isolator-metal capacitor has an insulator layer whose thickness is substantially smaller than a width of the insulator layer.

5. The circuit arrangement according to claim 4, wherein the width of the insulator layer is at least a hundred times the thickness of the insulator layer.

6. The circuit arrangement according to claim 1, wherein the at least one metallic conductor is formed as a plated through-hole.

7. The circuit arrangement according to claim 1, wherein the at least one metallic conductor is arranged substantially perpendicular to one of the metallization levels.

8. The circuit arrangement according to claim 1, wherein the first and/or the second DC terminal is placed in a symmetry plane positioned substantially perpendicular on one of the metallization levels.

9. The circuit arrangement according to claim 1, wherein the at least one first conductor loop has at least one first AC terminal for applying or tapping off a first high-frequency signal and/or the at least one second conductor loop has at least one second AC terminal for applying or tapping off a second high-frequency signal.

10. The circuit arrangement according to claim 1, wherein the first and/or the second DC terminal is provided mirror-symmetrically relative to a symmetry plane S positioned perpendicular on one of the metallization levels.

11. The circuit arrangement according to claim 1, wherein the at least one first and the at least one second conductor loops are placed overlapping at least in one subsection.

12. The circuit arrangement according to claim 1, wherein the at least one first and the at least one second conductor loops are formed congruent at least in one subsection.

13. The circuit arrangement according to claim 12, wherein the at least one first and the at least one second conductor loops include one or more AC terminals and are formed congruent with the exception of areas around the AC terminals.

14. The circuit arrangement according to claim 1, wherein the at least one first conductor loop and/or the at least one second conductor loop have one or more turns.

15. The circuit arrangement according to claim 14, wherein the turns of the at least one first and/or the at least one second conductor loop are designed substantially round, oval, piecewise straight, polygonal, rectangular, or square.

16. The circuit arrangement according to claim 1, further comprising an amplifier unit that has a first and a second terminal, the first terminal being connected to the at least one first conductor loop and the second terminal to the at least one second conductor loop, the first terminal being supplied with the first DC potential via the first DC terminal and the at least one first conductor loop and the second terminal with the second DC potential via the second DC terminal and the at least one second conductor loop.

17. The circuit arrangement according to claim 16, wherein the amplifier unit has at least one transistor.

18. The circuit arrangement according to claim 17, wherein the first terminal of the amplifier unit is formed as a collector or drain terminal of the transistor and the second terminal of the amplifier unit is formed as a base or gate terminal of the transistor.

19. An Integrated circuit comprising the circuit arrangement according to claim 1.

20. The Integrated circuit according to claim 19, wherein the integrated circuit is formed as a monolithically integrated circuit, as a hybrid circuit, or as a multilayer ceramic circuit.

* * * * *